United States Patent
Kojima et al.

(10) Patent No.: US 7,554,412 B2
(45) Date of Patent: Jun. 30, 2009

(54) PHASE-LOCKED LOOP CIRCUIT HAVING CORRECTION FOR ACTIVE FILTER OFFSET

(75) Inventors: Hiroaki Kojima, Tokyo (JP); Isamu Matsushima, Saitama (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/209,267

(22) Filed: Aug. 22, 2005
(Under 37 CFR 1.47)

(65) Prior Publication Data
US 2006/0114069 A1 Jun. 1, 2006

(30) Foreign Application Priority Data
Aug. 20, 2004 (JP) ............... 2004-241028

(51) Int. Cl.
*H03L 7/087* (2006.01)
*H03L 7/093* (2006.01)
(52) U.S. Cl. .................. 331/11; 327/157; 375/376
(58) Field of Classification Search .................. 331/11, 331/10; 327/157; 375/376
See application file for complete search history.

(56) References Cited
U.S. PATENT DOCUMENTS
4,069,462 A * 1/1978 Dunn .................. 331/11
4,404,530 A * 9/1983 Stryer .................. 331/11
4,542,351 A * 9/1985 Okada .................. 331/11
5,254,955 A * 10/1993 Saeki et al. .................. 327/156
5,525,935 A 6/1996 Joo et al.
5,546,433 A * 8/1996 Tran et al. .................. 375/376
6,812,797 B1 * 11/2004 De Veirman et al. .......... 331/11

* cited by examiner

*Primary Examiner*—Robert Pascal
*Assistant Examiner*—James E Goodley
(74) *Attorney, Agent, or Firm*—William B. Kempler; W. James Brady; Frederick J. Telecky, Jr.

(57) ABSTRACT

A phase locked loop (PLL) circuit automatically corrects the offset of the analog (especially active type) loop filter to improve the stability and precision of the locked clock or frequency signals. In addition to the general PLL circuit configuration having active type loop filter (30), the PLL circuit also has a frequency comparing circuit (42), a DAC controller (44) and a DAC (digital-to-analog converter) (46). In an offset measurement mode, the outputs of phase error detecting circuit (12, 14) and frequency error detecting circuit (18, 20) are cut, respectively, to establish locking in offset measurement locked loop (42, 44, 45, 30, 40). In this case, offset correction code (EDs) are identified and held. In normal mode, DAC controller (44) has offset correction code (ED) input to DAC (46), and DAC (46) sends offset correction signal (EAs) to loop filter (30).

11 Claims, 4 Drawing Sheets

REPRODUCED RF SIGNAL

HOLD PERIOD

DEFECT SIGNAL

HOLD PERIOD

OUTPUT OF OP AMP (EMBODIMENT)

OUTPUT OF OP AMP (REFERENCE EXAMPLE A)

PULL IN RANGE

OUTPUT OF OP AMP (REFERENCE EXAMPLE B)

PULL IN RANGE

OUTPUT OF OP AMP (REFERENCE EXAMPLE C)

PULL IN OPERATION
PULL IN RANGE

OUTPUT OF OP AMP (REFERENCE EXAMPLE D)

PULL IN RANGE
PULL IN OPERATION

PHASE-LOCKED LOOP CIRCUIT HAVING CORRECTION FOR ACTIVE FILTER OFFSET

The present invention relates to a phase-locked loop (PLL) circuit; and, in particular, to a PLL circuit that contains an analog loop filter.

BACKGROUND OF THE INVENTION

FIG. 5 illustrates the basic layout of a digital PLL circuit that contains an analog loop filter. This PLL circuit comprises a clock signal input/output type phase comparing circuit 100, an analog loop filter 102, and an analog input/output type voltage-controlled oscillator (VCO) 104. An input clock signal INCK and the feedback clock signal PLLCK output from VCO 104 are input to phase comparing circuit 100, which outputs analog phase error signal Φer representing the phase error of the two clock signals INCK, PLLCK. Loop filter 102 is a low-pass filter, which integrates phase error signal Φer output from phase comparing circuit 100. The output voltage of loop filter 102 is a control voltage Sv, which is input to VCO 104. VCO 104 oscillates and outputs variable frequency clock PLLCK whose frequency corresponds to control voltage Sv. When the phase error of input clock INCK and VCO clock PLLCK of the PLL circuit is not zero, the phase error signal Φer passes through the loop filter and is output as control voltage Sv, which is fed to VCO 104, and the frequency of clock PLLCK is changed until the phase error becomes zero.

Typically, loop filters 102 are classified as active types comprising op amps and passive types made up of RC circuits. FIG. 6 illustrates an example layout of an active type filter. The illustrated active loop filter 102 includes an integrator comprising an op amp 106 as well as an input resistor 108 and an RC feedback circuit (110, 112). In this integrator, the output terminal of phase comparing circuit 100 is connected to inverting input terminal (−) of op amp 106 via input resistor 108, reference voltage $V_{REF}$ is applied to non-inverting input terminal (+), and resistor 110 and capacitor 112 are connected in series between inverting input terminal (−) and the output terminal. The transfer function or integration constant of the loop filter 102 is a function of the resistance values of input resistor 108 and feedback resistor 110 and of the capacitance of capacitor 112.

Phase comparing circuit 100 includes a comparator (not shown in the figure) that outputs an up signal UP or down signal DW corresponding to the phase error of the two clock signals INCK and PLLCK, and charge pump circuit 114 in the output section or a subsequent section. If the phase of PLL clock PLLCK leads the phase of input clock INCK, the up signal UP is output from the comparison part. During the period of output of the up signal UP, switch 116 on the positive electrode side power source voltage Vdd side of charge pump circuit 114 is turned on. As a result, phase error signal Φer increases, output voltage Sv of loop filter 102 decreases, and the frequency of PLL clock PLLCK moves lower. When the phase of PLL clock PLLCK lags the phase of input clock INCK, down signal DW is output from the comparison part, and during the period when down signal DW is output, switch 118 on the negative electrode side power (source voltage Vss side) of charge pump circuit 114 is turned on. As a result, phase error signal Φer decreases, output voltage Sv of loop filter 102 increases, and the frequency of PLL clock PLLCK moves higher.

Reference voltage $V_{REF}$ applied to the non-inverting input terminal (+) of op amp 106 may be set at any voltage value. When charge pump circuit 114 is set in the output section of phase comparing circuit 100 as described above, it may also be set at the central level of the power source voltage (Vdd/2). Also, one may also adopt the following method: In charge pump circuit 114, a constant-current source (not shown in the figure) for the source current may be set between the positive electrode side power source voltage terminal and switch 116, and at the same time, a constant current source for the sink current (not shown in the figure) may be arranged between switch 118 and the negative electrode side power source voltage terminal. Switches 116, 118 are usually made up of transistors.

In this way, as loop filter 102 is an active filter, compared with the passive type, not only can a higher gain be obtained, but it is also possible to prevent the variation in the output of loop filter 102 (that is, control voltage Sv) from influencing the input to loop filter 102 (that is, the output of phase comparing circuit 100), which is advantageous. In particular, for PLL circuits used in clock data recovery (CDR) in the reproduction of optical disks, the as CDs (Compact Disks), DVDs (Digital Versatile Disks), etc., because the control voltage varies as a function of the reproduction speed, an active type filter is preferred. With the passive type filter, the variation in the control voltage is transmitted via the loop filter to the output of the phase comparing circuit, and has an adverse influence on the balance of the source current/sink current in the charge pump circuit, so that the lock point of the signal reproduction tends to deviate. With the active type filter, even when the control voltage varies according to the reproduction speed, because the variation in the voltage is not transmitted to the output of the phase comparing circuit, the balance of the source current/sink current in the charge pump circuit does not collapse, and it is possible to hold the lock point of the signal reproduction over a wide band with high stability.

However, because the active type loop filter makes use of the op amp, the offset of the attached parts to the op amp has an adverse influence on the various characteristics of the PLL circuit, which is undesirable. For example, in a PLL circuit for optical disk reproduction, the input signal is not the clock itself. Instead, the input signal is given as a binary pulse sequence signal or serial data stream having plural types of pulse widths. For the PLL circuit, it is necessary to have a function in detecting the regularity of the serial data stream and to read the channel clock information from each pulse edge (extraction). For this purpose, in addition to expanding the locked range, a frequency comparing circuit is set in phase comparing circuit 100 or parallel to it. The frequency comparing circuit can form a frequency-locked loop with loop filter 102 and VCO 104.

For this type of application, the problem is that the serial data stream may be cut off instantly in reproduction due to fingerprints, dirt, scratches, etc. on the surface of the optical disk. In the case, from the former-section circuit or control circuit that detects that the reproduction RF signal is missing, defect signal DF is generated, and, corresponding to this defect signal DF, the VCO oscillation frequency is held. For example, in the configuration shown in FIG. 6, when defect signal DF becomes active (on), two switches 116, 118 of charge pump circuit 114, are forcibly turned on at the same time. As a result, the output of charge pump circuit 114 becomes a high impedance as viewed from the side of input resistor 108. At this time, the path from the output of charge pump circuit 114 to input resistor 108 has an impedance very high (ideally, infinitely high) so that the resistance of input resistor 108 with respect to the inverted input (−) of op amp 106 can be ignored. Consequently, the integration speed becomes infinitely slower, and, it seems that the output voltage of op amp 106, that is, VCO control voltage Sv, is held in this state. As a result, VCO 104 can go into self-running mode while the oscillation frequency right before cut off of the serial data stream is maintained as is.

However, when op amp 106 has an offset, the offset voltage becomes DC related to the hold state, and, although defect signal DF goes on, VCO control voltage Sv varies, so that undesired changes take place in the oscillation frequency of VCO 104. If the changes in the oscillation frequency are within the lock range (phase pull-in range) of phase comparing circuit 100, there are no problems. However, if they go out of the lock range, frequency-locking deviates. As a result, it is necessary to start the frequency-locked loop after the release of defect signal DF so as to pull in the frequency to start over again, and it takes a long time to re-establish phase locking. As the time for re-establishing the phase locking becomes longer, during reproduction of CD or DVD playback, data may be skipped, causing audio gaps or freezing of the picture, which is undesirable for the user in enjoying the program.

Another disadvantage when there is an offset in the op amp of the active type loop filter is in the reduction in the phase margin during locking of the pulse sequence of the serial data stream with the PLL clock signal. Usually, the serial data stream read from the optical disk or the like has a significant jitter component due to variation in the bit length when the disk is manufactured. Consequently, like judgment of a 0 or 1 at the center of the eye pattern, if locking is not realized for the center of the eye pattern, it is quite possible that erroneous data detection will take place under influence of the jitter. Consequently, in the PLL circuit for CDR, timing design is performed so that with PLL clock locked to the channel clock, the edge of the PLL clock (lock point) comes to the center of the eye pattern. However, when there is an offset in the loop filter, the lock point deviates from the center of the eye pattern corresponding to the magnitude of the offset. As a result, the error rate of the reproduction data increases.

In the prior art, although there exists certain offset in the op amp of the loop filter, the influence of offset can be avoided by adjusting the values of input resistor 108 and feedback circuit (110, 112) so as to lower the speed of the integrator (the gradient of the output variation slope). However, there has been a trend to increase of the frequency of the serial data stream for higher speed, and, as a result, in the reproduction of optical disk, there is a demand for higher speed for the pull-in characteristics from the seek operation in the reproduction of the optical disk. Consequently, it is necessary to increase the speed of the integrator in the loop filter, and it is necessary to sacrifice the offset resistance of the op amp. In this way, for the method of adjustment of the characteristics of the integrator in the loop filter, there is a trade-off between the various required properties, so that it is impossible to improve all of the required properties at the same time.

The purpose of the present invention is to solve the aforementioned problems of the prior art by providing a phase-locked loop (PLL) circuit characterized by the fact that it can automatically correct for the offset of the analog (especially the active type) loop filter and it can improve the stability and precision for the locked clock and frequency.

SUMMARY

A phase-locked loop circuit is provided for generating a clock signal locked to an input signal, comprising in a first embodiment a voltage-controlled oscillator that oscillates and outputs the clock signal and changes the frequency of the clock signal corresponding to an analog control voltage; a first comparator that compares the frequency and/or phase of the input signal and the clock signal fed back from the voltage-controlled oscillator and outputs a first analog error signal corresponding to the comparison result; a loop filter to which is input the first analog error signal from the first comparator as input, and which integrates the first analog error signal and outputs the control voltage to the voltage-controlled oscillator; a second comparator that compares the frequency and/or phase of a reference clock signal with the clock signal fed back from the voltage-controlled oscillator and outputs a signal indicating the comparison result; and an offset corrector that feeds the second analog error signal corresponding to the output signal of the second comparator to the loop filter in the state in which the input of the loop filter is cut off from the output of the first comparator, identifies the value of the second analog error signal the offset correction value when the fed-back clock signal is locked to the reference clock signal as, and feeds the analog offset correction signal having the offset correction value to the loop filter in the state in which the input of the loop filter is connected to the output of the first comparator.

In the aforementioned configuration, since the output of the first comparator is cut off from the input of the loop filter, and the second analog error signal from the offset corrector is input to the loop filter, and locking is established in this state, the output current of the op amp in the loop filter becomes nearly zero. The offset corrector identifies the value of the second analog error signal in this case as the offset correction value. Then, when the output of the first comparator is connected to the input of the loop filter for performing the normal operation, with the offset corrector, the analog offset correction signal having the offset correction value is sent to the loop filter, so that it is possible to correct the offset of the op amp in the loop filter or to cancel it, and, in this way, it is possible to make the conventional synchronization loop work.

As a preferred method of the present invention, the offset corrector has the following parts: a code changing circuit that can change the digital code corresponding to the output signal of the second comparator, a code holding circuit that holds the code corresponding to the offset correction value from the codes selected by the code changing circuit as an offset correction code, and a digital-to-analog converter that converts the code sent from the code changing circuit or the code holding circuit into an analog signal and uses it as the second analog error signal or the offset correction signal. In this configuration, because there is a unique relationship of correspondence between the offset correction code and the offset correction value or offset correction signal, it is possible to indirectly identify the offset correction value by directly identifying the offset correction code (with signal processing).

As a preferred method of the present invention, the loop filter has an op amp. In this case, in order to form a low-pass filter or integrator with the op amp, one may adopt the following scheme: a first resistor is connected between the output terminal of the first comparator and the inverting input terminal of the op amp, a feedback circuit at least containing a capacitor is connected between the non-inverting input terminal and the output terminal, and the output terminal of the op amp is connected to the input terminal of the voltage-controlled oscillator.

As another preferred method of the present invention, in order to increase the measurement resolution of the offset correction and the correction resolution, the output terminal of the second comparator is connected via a second resistor to the inverting input terminal of the op amp, and a prescribed reference voltage is input to the non-inverting input terminal of the op amp. As another preferred method, the output terminal of the second comparator is connected to the non-inverting input terminal of the op amp, and a prescribed reference voltage is input to the inverting input terminal of the op amp. In this case, as the reference voltage is fed from a reference voltage generator via a third resistor to the inverting input terminal of the op amp, it is possible to further increase the measurement resolution of offset correction and the correction resolution.

Also, as a preferred method of the present invention, the first comparator has a frequency comparing circuit that compares the frequency of the input signal to the frequency of the clock, and outputs the frequency error signal corresponding to the comparison error, and a phase comparing circuit that compares the phase of the input signal and the phase of the clock, and outputs the phase error signal corresponding to the comparison error; the frequency comparing circuit bring the frequency of the clock in agreement with the frequency of the input signal, and the phase comparison output brings the phase of the clock in agreement with the phase of the input signal. As a result, the configuration has both a frequency comparing circuit and a phase comparing circuit, so that it is possible to establish locking in the normal operation with a high reliability. Also, the first comparator may have either a frequency comparing circuit or a phase comparing circuit.

Also, as a preferred method of the present invention, the input signal is a binary pulse sequence signal whose pulse width varies as an integer multiple of the bit period; the frequency comparing circuit detects the frequency of the channel clock that defines the bit period of the pulse sequence signal, and compares the detected frequency of the channel clock with the frequency of the clock; and the phase comparing circuit compares the time of the pulse edge of the pulse sequence signal and the time of the clock edge of the clock on the time axis. According to the present invention, it is possible to correct the offset of the loop filter, so that it is possible to perform clock reproduction and signal reproduction identification with high precision in a stable and reliable way.

A phase-locked loop circuit in accordance with another embodiment for generating an analog frequency signal locked to the analog input signal comprises a voltage-controlled oscillator that oscillates and outputs the frequency signal and changes the frequency of the frequency signal corresponding to the control voltage; a first comparator that compares the input signal and the frequency signal fed back from the voltage-controlled oscillator for frequency and/or phase, and outputs the first error signal corresponding to the comparison result; a loop filter to which is input the first error signal from the first comparator, which integrates the first error signal and outputs the control voltage to the voltage-controlled oscillator; a second comparator that compares any reference frequency signal and the frequency signal fed back from the voltage-controlled oscillator for frequency and/or phase, and outputs a signal indicating the comparison result; and an offset corrector that feeds the second error signal corresponding to the output signal of the second comparator to the loop filter in the state in which the input of the loop filter is cut off from the output of the first comparator, identifies the value of the second error signal as the offset correction value when the feedback frequency signal is locked to the reference frequency signal, and feeds the offset correction signal having the offset correction value to the loop filter in the state in which the input of the loop filter is connected to the output of the first comparator.

In this complete analog type second PLL circuit, the same operation and effects as those of the first PLL circuit can also be realized.

Also, the third phase-locked loop circuit of the present invention is a phase-locked loop circuit characterized by the following facts: the phase-locked loop circuit has a voltage-controlled oscillator that outputs the oscillation signal of frequency corresponding to the control voltage, a first comparator to which the input signal and the oscillation signal is input and which generates the first error signal corresponding to the phase difference or frequency difference between the two signals, a second comparator to which the reference signal and the oscillation signal is input and which generates the first error signal corresponding to the phase difference or frequency difference between the two signals, a corrector that holds the second error signal and outputs the value of the held second error signal as the correction signal, and an active low-pass filter to which is input the first error signal and the correction signal, and which generates the control voltage; only the second error signal is fed to the low-pass filter, and the second error signal with the reference signal and the oscillation signal in agreement with each other is determined to be the correction signal; and the determined correction signal and the first error signal are fed to the low-pass filter so that the oscillation signal is in agreement with the input signal.

As a preferred method of the present invention, the low-pass filter has an op amp and an RC feedback circuit connected between the output of the op amp and the first input. Also, as another preferred method, the first error signal is fed via the first resistor element to the first terminal of the op amp, the correction signal is fed via the second resistor element to the first terminal of the op amp, and the reference voltage is fed to the second terminal of the op amp. In another method, the first error signal is fed via the first resistor element to the first terminal of the op amp, the correction signal is fed via the second resistor element to the second terminal of the op amp, and the reference voltage is fed to the first terminal of the op amp via a third resistor element.

In a preferred method of the present invention, the corrector has an analog/digital converter that outputs the digital code corresponding to the second error signal, and a digital-to-analog converter to which is input the digital code and which outputs the correction signal, and a digital-to-analog converter to which is input the digital code and which outputs the correction signal.

REFERENCE NUMERALS AND SYMBOLS AS SHOWN IN THE DRAWINGS

In the figures, 12 represents a phase error detecting circuit; 14 represents a charge pump circuit; 15, 22 represents resistors; 18 represents a frequency error detecting circuit; 20 represents a charge pump circuit; 30 represents a loop filter; 32 represents an op amp (operational amplifier); 38 represents a reference voltage generator; 40 represents a VCO (voltage-controlled oscillator); 42 represents a frequency comparing circuit; 44 represents a DAC controller; 46 represents a DAC (digital-to-analog converter); 48 represents a resistor (DAC output resistor).

DESCRIPTION OF EMBODIMENTS

With the phase-locked loop circuit of the present invention, due to the aforementioned configuration and operation, the offset of the analog (especially the active type) loop filter is automatically corrected, the stability and precision of the locked clock or locked frequency are improved, and the reliability of the PLL function can be improved.

Optimum Scheme for Embodiment of the Invention

In the following, an explanation will be given regarding a preferred embodiment of the present invention with reference to the annexed drawings.

Figure 1:
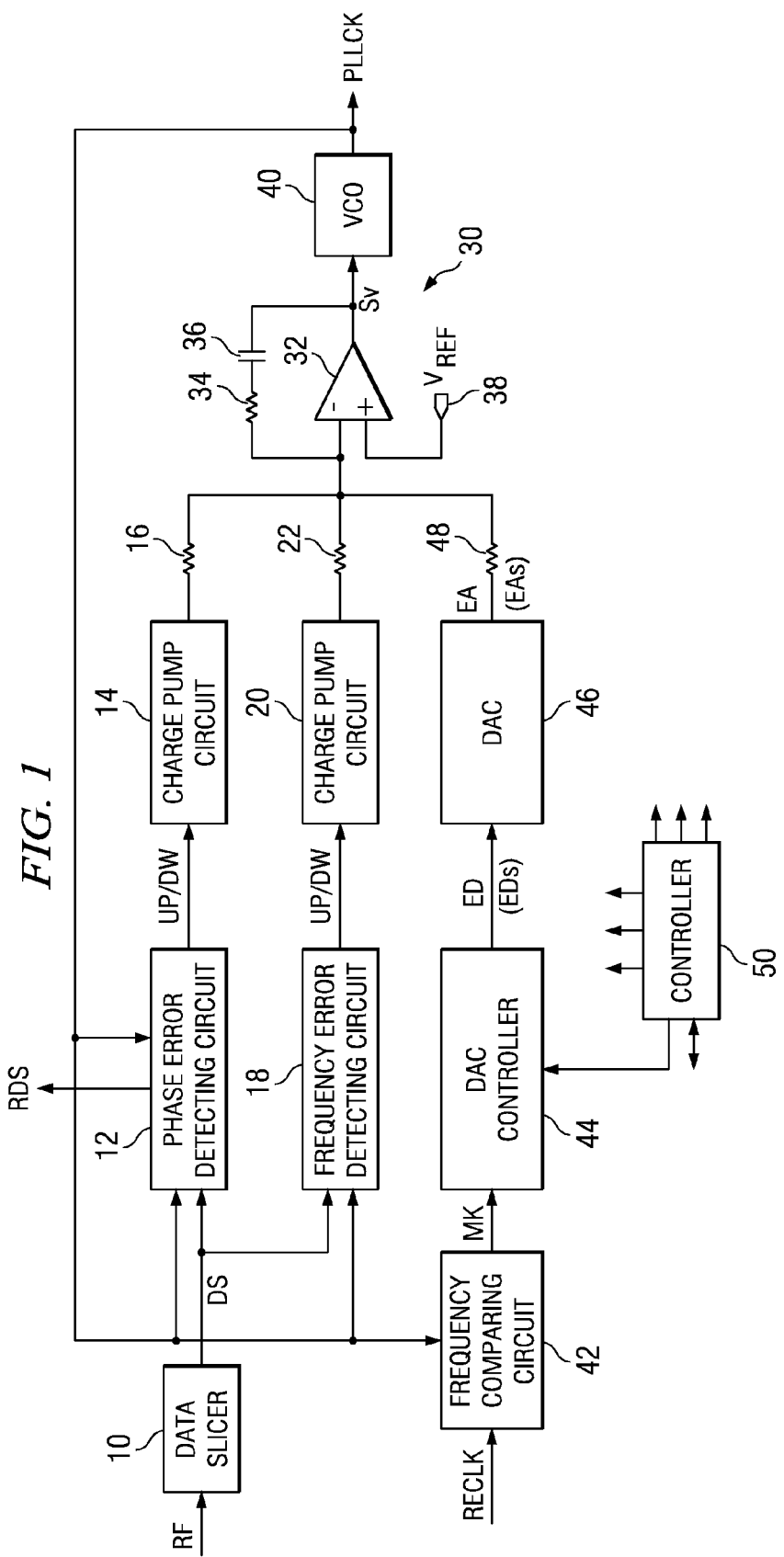
FIG. 1 is a block diagram illustrating the configuration of the PLL circuit in an embodiment of the present invention.

FIG. 1 is a diagram illustrating the configuration of the PLL circuit in an embodiment of the present invention. This PLL circuit is formed as a clock extraction type digital PLL circuit having an analog loop filter, and, for example, it can be applied to clock data recovery (CDR) during reproduction of optical disks, the as CDs and DVDs.

In data slicer 10 of the input section, for example, the reproduction RF signal (serial data stream with an analog waveform) output from the analog former-section circuit (not shown in the figure) of optical pickup or the like is input, and the input RF waveform is converted into binary NRZ (Non Result to Zero) pulse sequence signal (digital serial data stream) DS.

Voltage-controlled oscillator (VCO) 40 of the output section oscillates and outputs variable frequency clock PLLCK corresponding to the analog control voltage Sv given by loop filter 30. Loop filter 30 is an active type having op amp 32, and it forms an integrator. Resistor 34 and capacitor 36 are connected in series between inverting input terminal (−) and the output terminal of op amp 32. Reference voltage $V_{REF}$ of a constant value is sent from reference voltage generator 38 to non-inverting input terminal (+) of op amp 3. Although reference voltage $V_{REF}$ may be set to any value, it is also possible to select the intermediate value Vdd/2 of power source voltage Vdd in consideration of the relationship with charge pump circuits 14, 20 to be explained below.

In this PLL circuit, in order to realize reliable locking, there are a phase-locked loop and a frequency-locked loop. More specifically, between data slicer 10 and loop filter 30, the following parts are connected in parallel: a phase-locked loop type phase error detecting circuit comprised of phase error detector 12 and charge pump circuit 14, and frequency-locked loop based frequency error detecting circuit comprised of frequency error detector 18 and charge pump circuit 20.

In phase error detecting circuit, phase error detector 12 detects the pulse edge of input pulse sequence signal (serial data stream) DS input from data slicer 10. Then, the phase error between the pulse edge of the input pulse sequence signal DS and the clock edge of feedback clock PLLCK from VCO 40, and the phase error detection result is output in the form of up signal UP/down signal DW. That is, when the phase of clock PLLCK output from VCO 40 leads the phase of input pulse sequence signal DS, up signal UP is made active. When the phase of clock PLLCK lags behind the phase of input pulse sequence signal DS, down signal DW is made active.

Figure 6:
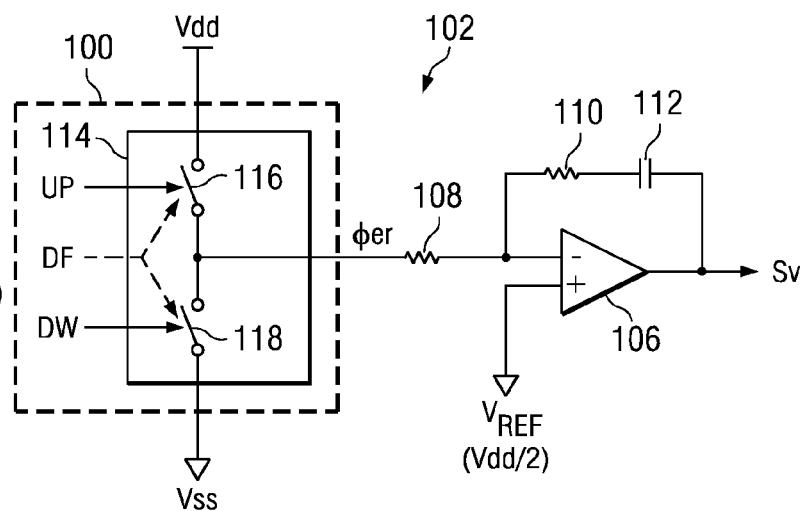
FIG. 6 is a circuit diagram illustrating an example of configuration of the loop filter in the PLL circuit shown in FIG. 5.

Charge pump circuit 14 may have the same configuration and operation as those of the circuit shown in FIG. 6. Consequently, during the period where phase error detector 12 makes up signal UP active, switch 116 on the positive electrode side power source voltage side is turned on, and the source current is fed via resistor 16 to inverting input terminal (−) of op amp 32 of loop filter 32. Also, during the period where phase error detector 12 makes down signal DW active, switch 118 on the negative electrode side power source voltage side is turned on, and the drain current is fed via resistor 16 to inverting input terminal (−) of op amp 30 in loop filter 30 via resistor 16. Resistor 16, together with resistor 34 and capacitor 36 of the feedback circuit, defines the transmission characteristics of the phase-locked loop system.

In this embodiment, phase error detector 12 also has a signal reproduction identification function. It makes use of clock PLLCK from VCO 40 to lock input pulse sequence signal DS, and generates reproduction pulse sequence signal (retimed data) RDS. The reproduction pulse sequence signal RDS and VCO clock PLLCK are sent to the signal processor (not shown in the figure) in the downstage section for decoding, error correction or other signal processing.

In the frequency error detecting circuit of the frequency-locked loop system, frequency error detector 18 detects the regularity of input pulse sequence signal DS input from data slicer 10, and detects the frequency of its channel clock. Then, the error between the channel clock frequency and the frequency of VCO clock PLLCK is compared, and the frequency error detection result is output in the form of up signal UP/down signal DW. That is, when the VCO oscillation frequency is higher than the channel clock frequency, up signal UP is made active. When the VCO oscillation frequency is lower than the channel clock frequency, down signal DW is made active.

Charge pump circuit 20 may be a circuit having the same configuration and operation as those of the circuit shown in FIG. 6. Consequently, during the period where frequency error detector 18 makes up signal UP active, switch 116 on the positive electrode side power source voltage side is turned on, and the source current if fed via resistor 22 to inverting input terminal (−) of op amp 30 in loop filter 30. Also, during the period where down signal DW is made active by frequency error detector 18, switch 118 on the negative electrode side power source voltage side is turned on, and the drain current is fed via resistor 22 to inverting input terminal (−) of op amp 30 of loop filter 30. Resistor 22, together with resistor 34 and capacitor 36 of the feedback circuit, defines the frequency-locked loop type transmission characteristics.

The PLL circuit in this embodiment has the main characteristic feature that the configuration has frequency comparing circuit 42, DAC controller 44, and digital-to-analog converter (DAC) 46. Frequency comparing circuit 42 is a circuit that works only in the offset measurement mode (to be explained below). In this case, together with input of feedback clock PLLCK from VCO 40, reference clock RECLK from a reference clock generator (not shown in the figure) is input, and comparison is made between frequencies $f_{PLL}$ and $f_{RE}$ of the clocks PLLCK and RECLK. The comparison result is output in the form of digital signal MK. For example, in this configuration, when $f_{PLL}=f_{RE}$, (0, 0) is output as the 2-bit comparison result signal MK. When $f_{PLL}>f_{RE}$, (1,0) is output; and, when $f_{PLL}<f_{RE}$(0, 1) is output. Also, one may select the frequency of reference clock RECLK at any value (constant value).

DAC controller 44 is a circuit for controlling DAC 46 of the latter section, and it always works, not only in the offset measurement mode. During the offset measurement mode, corresponding to comparison result signal MK from frequency comparing circuit 42, the digital input value or digital code ED for DAC 46 is varied or changed, until finally the digital code in the locked state is confirmed or identified as offset correction code EDs. In DAC controller 44, there is a register or memory for holding the data. Offset correction code EDs that is identified in the offset measurement mode is kept in this memory.

DAC 46 converts digital code ED input from DAC controller 44 to analog signal EA. Here, when offset correction code EDs is input from DAC controller 44, the analog signal output from DAC 46 is offset correction signal EAs. Analog signal EA (EAs) output from DAC 46 is sent through resistor 48 to inverting input terminal (−) of op amp 30 in loop filter 30.

Controller 50 is made up of, e.g., a microcomputer, and it controls the operation of the various parts and the entirety of the PLL circuit.

In the following, an explanation will be given regarding the operation of the PLL circuit in this embodiment. In this PLL circuit, there is a normal mode and an offset measurement mode. The normal mode is the mode in which CDR operation is performed in the reproduction of the optical disk. In the offset measurement mode, the offset that may be present in op amp 32 of loop filter 30 is indirectly measured, and offset correction mode EDs or offset correction signal EAs for canceling the offset is identified.

First, an explanation will be given regarding the operation in the offset measurement mode. In the offset measurement mode, during the period when the CDR operation is not performed, the operation may be performed corresponding to the prescribed command from the outside, or it may be performed in a prescribed internal routine (the as initialization).

In the offset measurement mode, under control of controller 50, the outputs of phase error detecting circuit 12, 14 of the phase-locked loop system and frequency error detecting circuit 18, 20 of the frequency-locked loop system are respectively cut off, that is, they are cut off from loop filter 30. Instead, offset measurement locked loop 42, 44, 46, 30, 40 is enabled. Also, in order to cut off the outputs of phase error detecting circuit 12, 14 and frequency error detecting circuit 18, 20, for example, switches 116, 118 of charge pump circuits 14, 20 may be forced off to a high impedance state.

In the offset measurement locked loop, comparison result output MK from frequency comparing circuit 42 is negatively fed back via DAC controller 44, DAC 46 and loop filter 30 to VCO 40. More specifically, when comparison result signal MK output from frequency comparing circuit 42 is (1, 0), indicating $f_{PLL} > f_{RE}$, corresponding to this state, the value of digital code ED is changed by DAC controller 44 in the direction for increasing the output of DAC 46 (analog signal EA). As a result, the output of loop filter 30 (control voltage Vs) is decreased, and the frequency of VCO clock PLLCK decreases. Also, when output MK of frequency comparing circuit 42 is (0, 1) and indicates $f_{PLL} < f_{RE}$, corresponding to this state, the value of ED is changed with DAC controller 44 in the direction for decreasing the output of DAC 46 (analog signal EA). As a result, the output of loop filter 30 (control voltage Vs) is increased, and the frequency of VCO clock PLLCK increases.

In this case, locking is established in offset measurement locked loop (42, 44, 46, 30, 40), and frequency $f_{PLL}$ of VCO clock PLLCK comes to agree with frequency $f_{RE}$ of reference clock RECLK. In this case, if op amp 32 of loop filter 30 is in an ideal state without offset, due to the partial short circuit between non-inverting input terminal (+) and inverting input terminal (−) of op amp 32, output voltage EA of DAC 46 is converged to reference potential $V_{RE}$ (Vdd/2). However, when there is an offset in op amp 32, output voltage EA of DAC 46 is converged to a voltage deviated from reference potential $V_{RE}$ (Vdd/2), so that the offset is cancelled on the input side of op amp 32. Deviation in the input voltage is indicated as the output offset of op amp 32 is displayed as the input-equivalent value. Saying that the offset measurement locked loop is locked means that the output current of op amp 32 becomes zero.

When comparison result output MK from frequency comparing circuit 42 is converged stably to (0, 0), DAC controller 44 judges the state as the locked state. In this case, DAC input code ED and DAC output signal EA are identified as offset correction code EDs and offset correction signal EAs, respectively, and offset correction code EDs is written in the memory. Right after that, controller 50 may terminate the offset measurement mode.

In the normal mode in which CDR works during reproduction of the optical disk, under control of controller 50, the outputs of phase error detecting circuit 12, 14 of the phase-locked loop system and frequency error detecting circuit 18, 20 of the frequency-locked loop system are connected to the input of loop filter 30, respectively. On the other hand, the input of DAC controller 44 is cut off from the output of frequency comparing circuit 42, and the offset measurement locked loop becomes the OFF state.

In this embodiment, at first, only frequency-locked loop 18, 20, 30, 40 is made to work to establish frequency locking (tuning). Then, after completion of frequency tuning, switching is made from the frequency-locked loop to the phase-locked loop 12, 14, 30, 40 to establish phase locking. In the normal mode, DAC controller 44 sets code ED input to DAC 46 in offset correction mode EDs, and DAC 46 outputs offset correction signal EAs. As a result, no matter how loop filter 30 is offset, it is still possible to establish the frequency-locked or phase-locked state with the offset cancelled.

In this way, in the PLL circuit of this embodiment, the offset of active type loop filter 30 is cancelled and the CDR operation is performed. Consequently, it is possible always to set the lock point for locking of input pulse sequence signal (serial data stream) DS with reproduction clock PLLCK at the center of the eye pattern, and it is possible to improve the signal reproduction identification ability.

Also, even in the hold treatment in the case of instant cut-off of the input pulse sequence signal (serial data stream) DS due to fingerprints, dirt, scratches, etc. on the surface of the optical disk, it is possible to cancel the influence of offset of op amp 32 during the hold period so as to suppress variations in the output of lower limit 30 to a minimum. Consequently, it is possible to prevent deviation of locking, and it is possible to perform the CDR recovery operation after the hold period at a high speed.

Figure 2A:
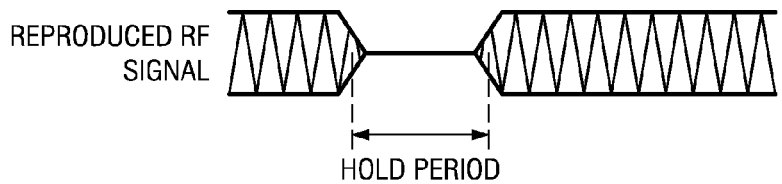
FIGS. 2A-2G are signal waveform diagrams illustrating schematically an example of the offset correction effect in the embodiment.
Figure 2B:
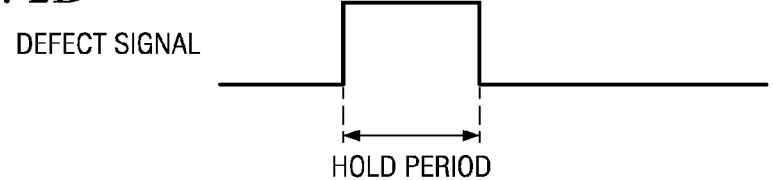
Figure 2C:
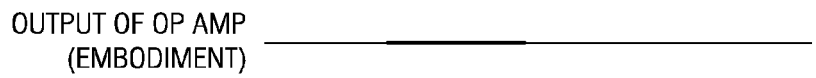

FIGS. 2A-2G are schematic diagrams illustrating the operation and effect of the present invention pertaining to hold treatment of CDR. FIG. 2C shows the output waveform of op amp 32 obtained with the circuit configuration (embodiment) shown in FIG. 1, and FIGS. 2D-2G show the output waveforms of op amp 32 obtained in configurations (reference examples) prepared by omitting frequency comparing circuit 42, DAC controller 44 and DAC 46 as characteristic features of the circuit configuration shown in FIG. 1 of the present invention.

Figure 2D:
Figure 2E:
Figure 2F:
Figure 2G:
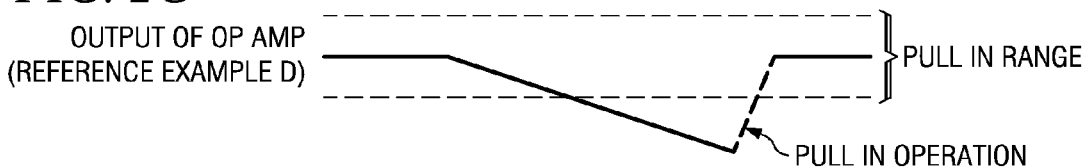

According to the present invention, as shown in FIG. 2C, during the hold period, the influence of the offset of the op amp in the active type loop filter can be cancelled. Consequently, it is possible to hold the op amp output at the value right before hold. On the other hand, as a reference example, if there an offset in the op amp of the active type loop filter, the output of the op amp varies during the hold period corresponding to the magnitude of the offset. When the offset of the op amp is smaller, as shown in FIGS. 2D and 2E, even when the output of the op amp (VCO control voltage) varies during the hold period, it is still converged in the locked range. However, if the offset of the op amp is larger, as shown in FIGS. 2F and 2G, the output of the op amp goes out of the lock range, and a long time is needed for the operation of the re-engagement.

In this embodiment, resistor 48 is inserted between DAC 46 and loop filter 30. As will be explained below, this resistor 48 has the function in improving the measurement resolution in the offset measurement mode.

Because the output offset of op amp 32 in the input equivalent value is extremely small (several mV), in order to perform correct offset measurement, a DAC element with a high resolution is preferred. Also, when the output voltage of DAC 46 is added at the input of op amp 32, what is obtained after amplification of the voltage with the open-loop gain (usually about 60 dB) appears at the output of op amp 32. Consequently, in the system of the present invention, when the voltage is added in the input portion of op amp 32 to correct the output offset, it is necessary to use a DAC element with a sufficiently high resolution to generate offset correction signal EA. However, use of a DAC element with a high resolution only for offset correction is undesirable from the standpoint of cost. In this embodiment, the problem is solved by setting resistor 46 on the output side of DAC 46.

Figure 3:
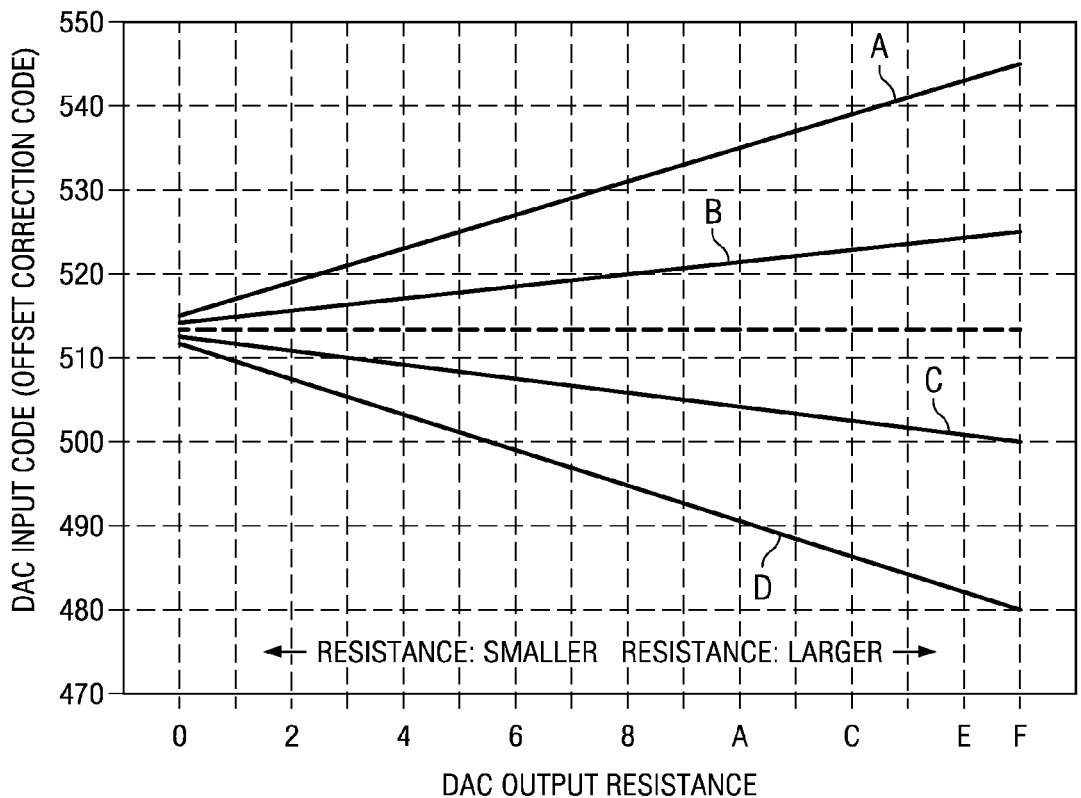
FIG. 3 is a graph illustrating the operation of the DAC output resistor in the embodiment.

FIG. 3 is a graph illustrating the relationship between the magnitude (relative value) of the resistance of resistor 48 and offset correction code EDs obtained by DAC controller 42 when a 10-bit analog/digital converter is used as DAC 46. Graphs A, B, C, D each correspond to the samples, respectively. That is, graph A corresponds to the case when there is a relatively large offset on the + side; graph B corresponds to the case when there is a relatively small offset on the + side; graph C corresponds to the case when there is a relatively small offset on the – side; and graph D corresponds to the case when there is a relatively large offset on the – side. That is, one can see that the larger the deviation from the ideal value of "511" free of offset, the larger the output offset of the sample.

From the characteristics shown in FIG. 3, it can be seen that the larger the resistance of DAC output resistor 46, the larger offset correction code EDs in DAC controller 42 in the offset measurement mode, and as a result, the measurement resolution can be increased.

Also, DAC output resistor 46 not only can be used in the offset measurement mode, but can also be used continuously in normal mode as is. That is, even in the normal mode, as in the offset measurement mode, offset correction mode EDs is given from DAC controller 42, DAC 46 outputs offset correction signal EAs. This offset correction signal EAs is input via resistor 48 to op amp 30.

Also, more strictly speaking, correction of offset in this embodiment is realized by means of current injection instead of voltage addition. Also, in the offset measurement mode, the current injection quantity needed for setting the output current of op amp 32 to zero is measured. In summary, the same current as the current injection quantity obtained in the offset measurement mode may also be injected into the input of op amp 32 from the side of DAC 46 even during normal mode operation (CDR operation). Consequently, when the resistance of DAC output resistor 48 is increased, in order to obtain the same current injection quantity, the output voltage of DAC 46 should be increased. As a result, it is possible to increase the measurement resolution and correction output resolution.

Also, when the dispersion range of offset of op amp 32 is known beforehand, it is possible to realize improvement of the resolution even by reducing the output voltage range of DAC 46 to the range where the necessary current correction quantity is obtained. For example, by halving the output voltage range, it is possible to realize the same effect as that obtained by increasing the resolution of DAC 46 by 1 bit. Usually, because the output offset of op amp 32 in the input equivalent value is very small, there is no need to expand the output range of DAC 46.

As explained above, by making an appropriate combination of output resistor 48 of DAC 46 and the output voltage range, it is possible to well realize the operation and effect of the present invention without increasing the cost and without using a DAC element with high resolution.

Figure 4:
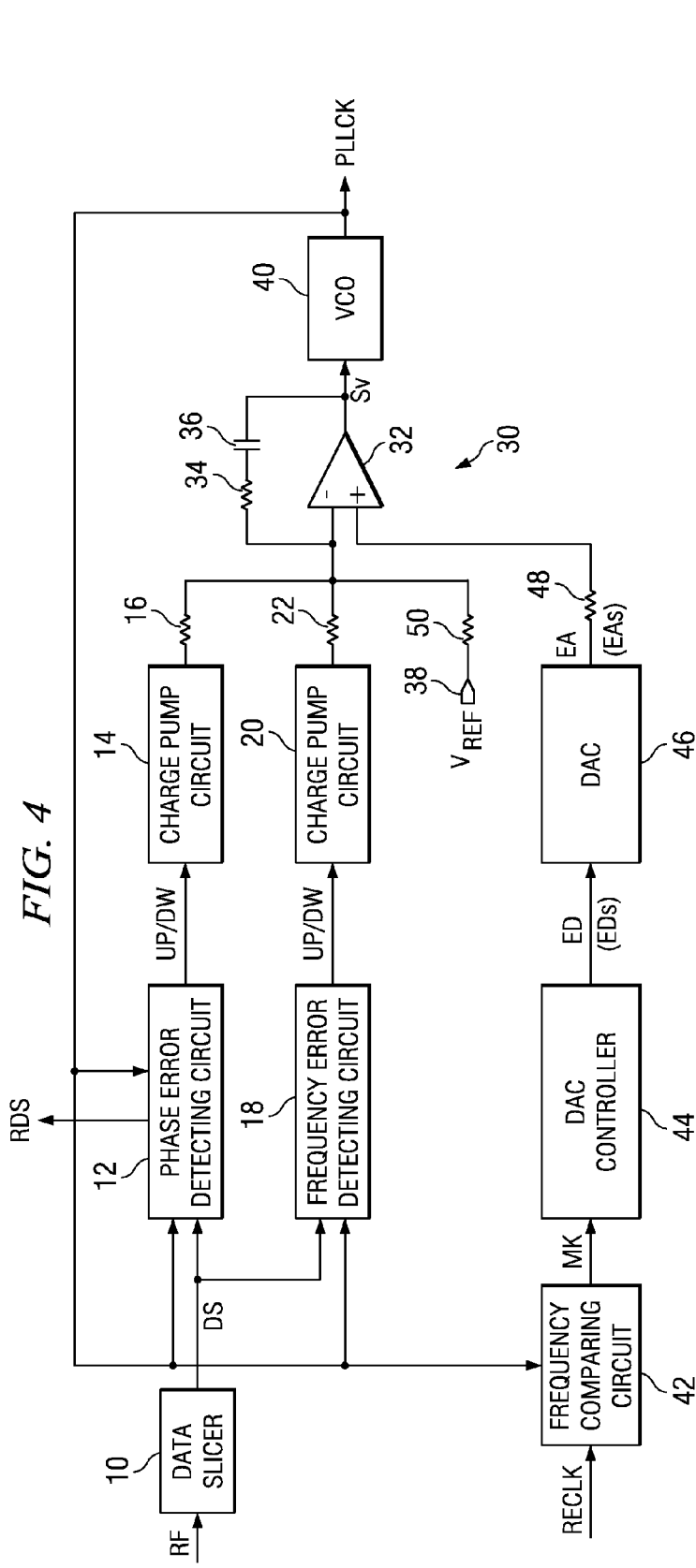
FIG. 4 is a block diagram illustrating the configuration of the PLL circuit in a modification example of the embodiment.
Figure 5:
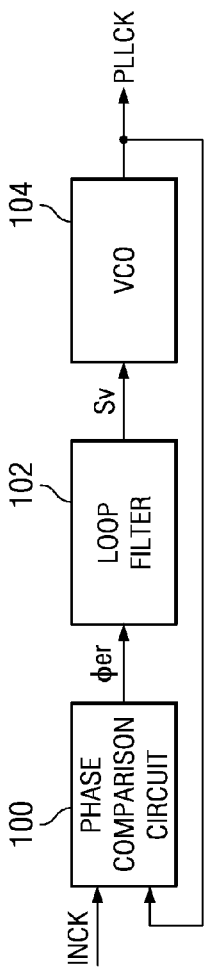
FIG. 5 is a block diagram illustrating the basic configuration of the digital type PLL circuit having an analog loop filter.

FIG. 4 is a diagram illustrating a modification example of the aforementioned embodiment. In this modification example, contrary to the circuit configuration shown in FIG. 1, the output of DAC 46 is input to non-inverting input terminal (+) of op amp 32, and reference voltage $V_{REF}$ from reference voltage generator 38 is input via resistor 50 to inverting input terminal (–) of op amp 32. Here, too, the outputs of phase error detecting circuit 12, 14 and frequency error detecting circuit 18, 20 may be applied to inverting input terminal (–) of op amp 32. Also, in FIG. 4, in order to simplify the drawing, controller 50 (FIG. 1) is omitted from the figure.

In the circuit configuration shown in FIG. 4, as in the aforementioned, offset measurement mode is also executed. As a result, offset correction code EDs obtained by DAC controller 44 is set at the DAC input code even in normal mode, and offset correction signal EAs is output from DAC 46. As a result, it is possible to correct any offset of the components attached to op amp 30. Also, by increasing the resistance of output resistor 50 of reference voltage generator 38, it is possible further to improve the measurement resolution and correction resolution. In addition, in this circuit configuration, it is possible to completely avoid the influence of the output of DAC 46 on the output on the side of phase error detecting circuit 12, 14 and frequency error detecting circuit 18, 20, that is, the output of charge pump circuits 14, 20. Consequently, it is possible to improve the stability of the phase-locked loop and frequency-locked loop which is also an advantage.

In the following, the main characteristic features in the aforementioned embodiment will be summarized.

Because it is possible to set the offset measurement result as the correction output in DAC controller 44, there is no need to perform any complicated computations, consult lookup tables, etc.

Because it is possible to use DAC 46 as an offset correction output element to measure the output offset of op amp 32 in loop filter 30, it is possible to reduce the assembly cost for the series of correction functions to a minimum.

Because the configuration has offset correction dedicated VCO frequency measurement (comparison) circuit 42 and DAC controller 44 added to it, there is no need to change or amend the existing circuits, the as frequency comparing circuit 12 phase comparing circuit 18, etc., and it is thus possible to suppress the risk in assembly to a minimum.

Because measurement of offset and setting of the correction value are performed with DAC controller 44 and DAC 46, even when there are scale error and linearity error in DAC 46 itself, there is entirely no influence on the offset correction function.

By setting resistor 48 in the DAC output portion, it is possible to realize a sufficiently high measurement resolution and correction resolution for practical application even when DAC with a high resolution (multi-bit) is not in use.

Because it is possible to perform offset measurement and offset correction in a short time without any external measurement equipment, it is possible to execute the series of offset correction processing (offset measurement, setting of correction values) as needed not only during manufacturing of the products, but also when the products are in use.

By performing a series of offset correction processes (offset measurement, setting of correction value) each time CDR operation is performed, it is possible to correct not only the offset due to manufacturing variations, but also the offset due to variations caused by fluctuations in power supply voltage and ambient temperature.

Because the offset measurement result can be recognized as a multi-bit digital signal with firmware, it is possible to use it in other applications for improving the characteristics of the products.

The present invention is not limited to the aforementioned embodiment. Various modifications may be made within the technical conceptual range of the present invention. For example, in the aforementioned embodiment, the frequency-locked loop system and the phase-locked loop system are set in parallel to perform the operation selectively. However, it is also possible for them to operate simultaneously, and it is also possible to have only one of them in the configuration. In the offset measurement portion, it is also possible to adopt a configuration with frequency comparing circuit 42 replaced with a phase frequency comparing circuit that compares the phase and frequency at the same time, or a phase comparing circuit that compares only the phase. Also, another frequency comparing circuit may be used concurrently as frequency comparing circuit 42 for offset measurement. In DAC controller 44, the function in holding offset correction code EDs may be arranged outside the circuit (the as in controller 50).

The aforementioned embodiment relates to a digital PLL circuit with input/output of clock signals. However, the present invention may also be adopted in a complete analog type PLL circuit with input/output of analog frequency signals. The configuration of loop filter 30 in the aforementioned embodiment is merely an example. This invention may be applied to any PLL circuit with an analog loop filter for which an offset exists. Consequently, CDR is also an example, and any PLL application is allowed.

The invention claimed is:

1. A phase-locked loop circuit which generates a clock or analog frequency signal locked to an input signal, comprising:
   a voltage-controlled oscillator that oscillates and outputs said clock or frequency signal and changes the frequency of said clock or frequency signal corresponding to a control voltage;
   a first comparator that in a normal operation mode compares at least one of the frequency and phase of said input signal with the clock or frequency signal fed back from an output of said voltage-controlled oscillator, and outputs a first error signal corresponding to the comparison result;
   an active loop filter having an inherent offset voltage receiving said first error signal from said first comparator, and which integrates said first error signal and outputs said control voltage to said voltage-controlled oscillator;
   a second comparator that compares at least one of the frequency and phase of a reference signal with the clock or frequency signal fed back from an output of said voltage-controlled oscillator, and outputs a signal corresponding to the comparison result; and
   an offset voltage corrector, that feeds a second error signal corresponding to the output signal of said second comparator to said active loop filter when the input of said active loop filter is cut off from the output of said first comparator, generates an offset correction value based on said second error signal when said fed-back clock or frequency signal is locked to said reference signal, and feeds an offset correction signal having the offset correction value to said active loop filter when the input of said active loop filter is connected to the output of said first comparator; wherein both said first error signal and said offset correction signal are input to the active loop filter in the normal operation mode.

2. The phase-locked loop circuit described in claim 1, wherein the offset corrector comprises:
   a code changing circuit that can change a digital code corresponding to the output signal of the second comparator,
   a code holding circuit that holds the code corresponding to the offset correction value from the codes selected by the code changing circuit as an offset correction code,
   and a digital-to-analog converter that converts the code sent from the code changing circuit or the code holding circuit into an analog signal and uses it as the second analog error signal or the offset correction signal.

3. The phase-locked loop circuit described in claim 1, wherein the loop filter includes an op amp.

4. The phase-locked loop circuit described in claim 3, further comprising a first resistor connected between an output terminal of said first comparator and an inverting input terminal of said op amp; and a feedback circuit, including at least one capacitor, connected between said inverting input terminal and an output terminal of the op amp; said output terminal of the op amp being connected to provide said control voltage to said voltage-controlled oscillator.

5. The phase-locked loop circuit described in claim 4, further comprising a second resistor connected between an output terminal of said second comparator and said inverting input terminal of said op amp, and a reference voltage source connected to a non-inverting input terminal of said op amp.

6. The phase-locked loop circuit described in claim 4, further comprising a second resistor connected between an output terminal of said second comparator and a non-inverting input terminal of said op amp.

7. The phase-locked loop circuit described in claim 1, wherein: the first comparator comprises:
   a frequency comparing circuit that compares the frequency of the input signal with the frequency of the clock or frequency signal, and outputs a frequency error signal corresponding to the comparison result; and
   a phase comparing circuit that compares the phase of the input signal with the phase of the clock or frequency signal, and outputs a phase error signal corresponding to the comparison result;
   wherein the frequency comparing circuit is used to bring the frequency of the clock or frequency signal into agreement with the frequency of the input signal, and the phase comparison output is used to bring the phase of the clock or frequency signal into agreement with the phase of the input signal.

8. The phase-locked loop circuit described in claim 7, wherein: the input signal is a binary pulse sequence signal whose pulse width varies as an integer multiple of a bit period;
   the frequency comparing circuit detects the frequency of the channel clock signal that defines the bit period of the binary pulse sequence signal, and compares the detected frequency of the channel clock signal with the frequency of the clock or frequency signal; and the phase comparing circuit compares the time of the pulse edge of the binary pulse sequence signal with the time of the clock or frequency signal edge of the clock or frequency signal on the time axis.

9. The phase-locked loop circuit described in claim 1, wherein the input signal is a serial data stream read from a recording medium.

10. A phase-locked loop circuit which generates a clock or analog frequency signal locked to an input signal, comprising:
- a voltage-controlled oscillator that oscillates and outputs said clock or frequency signal and changes the frequency of said clock or frequency signal corresponding to a control voltage;
- a first comparator that compares at least one of the frequency and phase of said input signal with the clock or frequency signal fed back from said voltage-controlled oscillator, and outputs a first error signal corresponding to the comparison result;
- an active loop filter having an offset to which is input said first error signal from said first comparator, and which integrates said first error signal and outputs said control voltage to said voltage-controlled oscillator;
- a second comparator that compares at least one of the frequency and phase of a reference clock or frequency signal with the clock or frequency signal fed back from said voltage-controlled oscillator, and outputs a signal corresponding to the comparison result;
- an offset corrector, that feeds a second error signal corresponding to the output signal of said second comparator to said active loop filter when the input of said active loop filter is cut off from the output of said first comparator, identifies an offset correction value based on said second error signal when said fed-back clock or frequency signal is locked to said reference clock or frequency signal, and feeds an offset correction signal having the offset correction value to said active loop filter when the input of said active loop filter is connected to the output of said first comparator;
- wherein the loop filter includes an op amp;
- further comprising a first resistor connected between an output terminal of said first comparator and an inverting input terminal of said op amp; and a feedback circuit, including at least one capacitor, connected between said inverting input terminal and an output terminal of the op amp; said output terminal of the op amp being connected to provide said control voltage to said voltage-controlled oscillator;
- a second resistor connected between an output terminal of said second comparator and a non-inverting input terminal of said op amp; and
- further comprising a third resistor, and a reference voltage source connected via said third resistor to said inverting input terminal of said op amp.

11. The phase-locked loop circuit which generates a clock or analog frequency signal locked to an input signal, comprising:
- a voltage-controlled oscillator that oscillates and outputs said clock or frequency signal and changes the frequency of said clock or frequency signal corresponding to a control voltage;
- a first comparator that compares at least one of the frequency and phase of said input signal with the clock or frequency signal fed back from said voltage-controlled oscillator, and outputs a first error signal corresponding to the comparison result;
- a loop filter comprising an op amp to which is input said first error signal from said first comparator, and which integrates said first error signal and outputs said control voltage to said voltage-controlled oscillator;
- a second comparator that compares at least one of the frequency and phase of a reference clock or frequency signal with the clock or frequency signal fed back from said voltage-controlled oscillator, and outputs a signal corresponding to the comparison result; and
- an offset corrector, that feeds a second error signal corresponding to the output signal of said second comparator to said loop filter when the input of said loop filter is cut off from the output of said first comparator, identifies an offset correction value based on said second error signal when said fed-back clock or frequency signal is locked to said reference clock or frequency signal, and feeds an offset correction signal having the offset correction value to said loop filter when the input of said loop filter is connected to the output of said first comparator;
- further comprising a first resistor connected between an output terminal of said first comparator and an inverting input terminal of said op amp; and a feedback circuit, including at least one capacitor, connected between said inverting input terminal and an output terminal of the op amp; said output terminal of the op amp being connected to provide said control voltage to said voltage-controlled oscillator, and a second resistor connected between an output terminal of said second comparator and a non-inverting input terminal of said op amp;
- further comprising a third resistor, and a reference voltage source connected via said third resistor to said inverting input terminal of said op amp.

* * * * *